United States Patent
Lam et al.

(10) Patent No.: US 8,258,925 B2
(45) Date of Patent: Sep. 4, 2012

(54) FREQUENCY SYNTHESIZER AND FREQUENCY SYNTHESIZING METHOD

(75) Inventors: Christopher Tin Sing Lam, Rowland Heights, CA (US); Shoufang Chen, Hsinchu (TW)

(73) Assignee: MSTAR Semiconductor, Inc., Hsinchu (TW)

( * ) Notice: Subject to any disclaimer, the term of this patent is extended or adjusted under 35 U.S.C. 154(b) by 1039 days.

(21) Appl. No.: 12/057,644

(22) Filed: Mar. 28, 2008

(65) Prior Publication Data

US 2008/0238628 A1  Oct. 2, 2008

Related U.S. Application Data

(60) Provisional application No. 60/908,979, filed on Mar. 30, 2007.

(51) Int. Cl.
*H04Q 5/22* (2006.01)
(52) U.S. Cl. .................................................. 340/10.1
(58) Field of Classification Search ............... 340/10.4, 340/572.1, 572.7; 342/51, 44; 375/316, 375/308; 327/149; 455/76, 260; 331/1 A
See application file for complete search history.

(56) References Cited

U.S. PATENT DOCUMENTS

| | | | | |
|---|---|---|---|---|
| 4,851,787 A | * | 7/1989 | Martin | 331/1 A |
| 5,568,078 A | * | 10/1996 | Lee | 327/262 |
| 5,621,412 A | * | 4/1997 | Sharpe et al. | 340/10.33 |
| 6,308,048 B1 | * | 10/2001 | Gore et al. | 455/76 |
| 6,617,962 B1 | * | 9/2003 | Horwitz et al. | 340/10.4 |
| 7,248,165 B2 | * | 7/2007 | Collins et al. | 340/572.1 |
| 7,292,649 B2 | * | 11/2007 | Atkinson et al. | 375/316 |
| 2004/0131130 A1 | | 7/2004 | Shor et al. | |
| 2005/0258940 A1 | | 11/2005 | Quan | |
| 2006/0255950 A1 | | 11/2006 | Roeder et al. | |
| 2007/0178869 A1 | * | 8/2007 | Park et al. | 455/260 |

FOREIGN PATENT DOCUMENTS

JP  2002-026762 A  1/2002

OTHER PUBLICATIONS

Tang, Y., Aktas, A., Ismail, M., Bibyk, S., Department of Electrical Engineering, The Ohio State University, "A Fully Integrated Dual-Mode Frequency Synthesizer for GSM and Wideband CDMA in 0.5 μM CMOS".

* cited by examiner

*Primary Examiner* — Jennifer Mehmood
*Assistant Examiner* — Kaleria Knox
(74) *Attorney, Agent, or Firm* — Kirton McConkie; Evan R. Witt

(57) ABSTRACT

A frequency synthesizer for providing clock signals with different frequencies for corresponding band transceivers and associated frequency synthesizing method are provided. The frequency synthesizer includes a phase-locked loop module having a single voltage controlled oscillator, a first frequency divider and a second frequency divider. At first, the single voltage controlled oscillator is activated to generate a primary clock signal. The first frequency divider frequency-divides the primary clock signal to generate a first clock signal for a first band transceiver. The first clock signal is further frequency-divided into a second clock signal for a second band transceiver. Therefore, the frequency synthesizer with the single voltage controlled oscillator can generate clock signals covering more than one frequency band.

15 Claims, 4 Drawing Sheets

FREQUENCY SYNTHESIZER AND FREQUENCY SYNTHESIZING METHOD

CROSS REFERENCE TO RELATED PATENT APPLICATION

This patent application claims the benefit of U.S. provisional patent application No. 60/908,979 filed Mar. 30, 2007.

FIELD OF THE INVENTION

The present invention relates to a frequency synthesizer and a frequency synthesizing method, and more particularly to a frequency synthesizer and a frequency synthesizing method for a radio frequency identification reader.

BACKGROUND OF THE INVENTION

Radio frequency identification (RFID) is an identification technology utilizing radio frequency (RF) signals to transmit and receive information in a wireless manner. Energy transfer occurs between the RFID communications. Therefore, RFID tag and RFID reader can exchange data without physical contact. Further, no additional power is needed for the RFID tag.

RFID system principally includes a tag and a reader. The tag implemented by a mini integrated circuit (IC) chip is embedded in or attached to an object. Then, the reader can read information stored in the IC chip by RFID technology.

For the great demand for higher data rates, longer accessible distances, and smaller antenna's size of the reader, there is a tendency towards higher-frequency wireless signal application. It is anticipated that ultrahigh frequency (UHF) band (860~960 MHz) and even microwave band (2.4~2.5 GHz) RFID system will take the place of the relative lower band (125 kHz and 13.56 MHz) RFID system in the near future.

For reading different tags operating at different frequency bands, a reader compatible with dual band is required. FIG. 1 is a block diagram exemplifying a frequency synthesizer conventionally used in a dual-band RFID reader. The frequency synthesizer 10 includes a phase-locked loop (PLL) module 101, a first frequency divider 102 and a second frequency divider 103. The PLL module 101 includes a phase/frequency detector (PFD) 1010, a charge pump 1011, a loop filter 1012, a first voltage controlled oscillator (VCO) 1013 and a second VCO 1014. In one example, the first VCO 1013 and the second VCO 1014 are selected to output first clock signals with frequency range from 1720 MHz to 1920 MHz and second clock signals with frequency range from 4.8 GHz to 5 GHz, respectively. After a divide-by-2 operation by corresponding frequency divider 102 or 103, the output clock signals are converted into third clock signals with frequency range from 860 MHz to 960 MHz or fourth clock signals with frequency range from 2.4 GHz to 2.5 GHz. Hence, the dual-band RFID reader using the frequency synthesizer 10 can reads both UHF band tags and microwave band tags. The plural VCOs, however, complicates the circuitry, occupies considerable chip area and consumes power. A frequency synthesizer with a simplified architecture is desired.

SUMMARY OF THE INVENTION

Therefore, the present invention provides a frequency synthesizer capable of covering different frequency bands with a reduced number of VCOs, e.g. a single VCO.

The present invention also provides a frequency synthesizing method for use in the frequency synthesizer with a reduced number of VCOs, e.g. a single VCO.

The present invention relates to a frequency synthesizer for providing clock signals with different frequencies for corresponding band transceivers. The frequency synthesizer includes a phase-locked loop module having a single VCO, a first frequency divider and a second frequency divider. A primary clock signal generated by the VCO is first frequency-divided by the first frequency divider to generate a first clock signal for a first band transceiver. The first clock signal from the first frequency divider is further frequency-divided by the second frequency divider to generate a second clock signal for a second band transceiver.

In an embodiment, the first and second band transceivers are both RFID readers. One operates at frequency range from 2.4 GHz to 2.5 GHz while the other operates at frequency range from 860 MHz to 960 MHz.

The present invention also relates to a frequency synthesizing method for providing clock signals with different frequencies for corresponding band transceivers. At first, a phase-locked loop module is activated to generate a primary clock signal. Then the primary clock signal is frequency-divided to generate a first clock signal for a first band transceiver. The first clock signal is further frequency-divided to generate a second clock signal for a second band transceiver.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
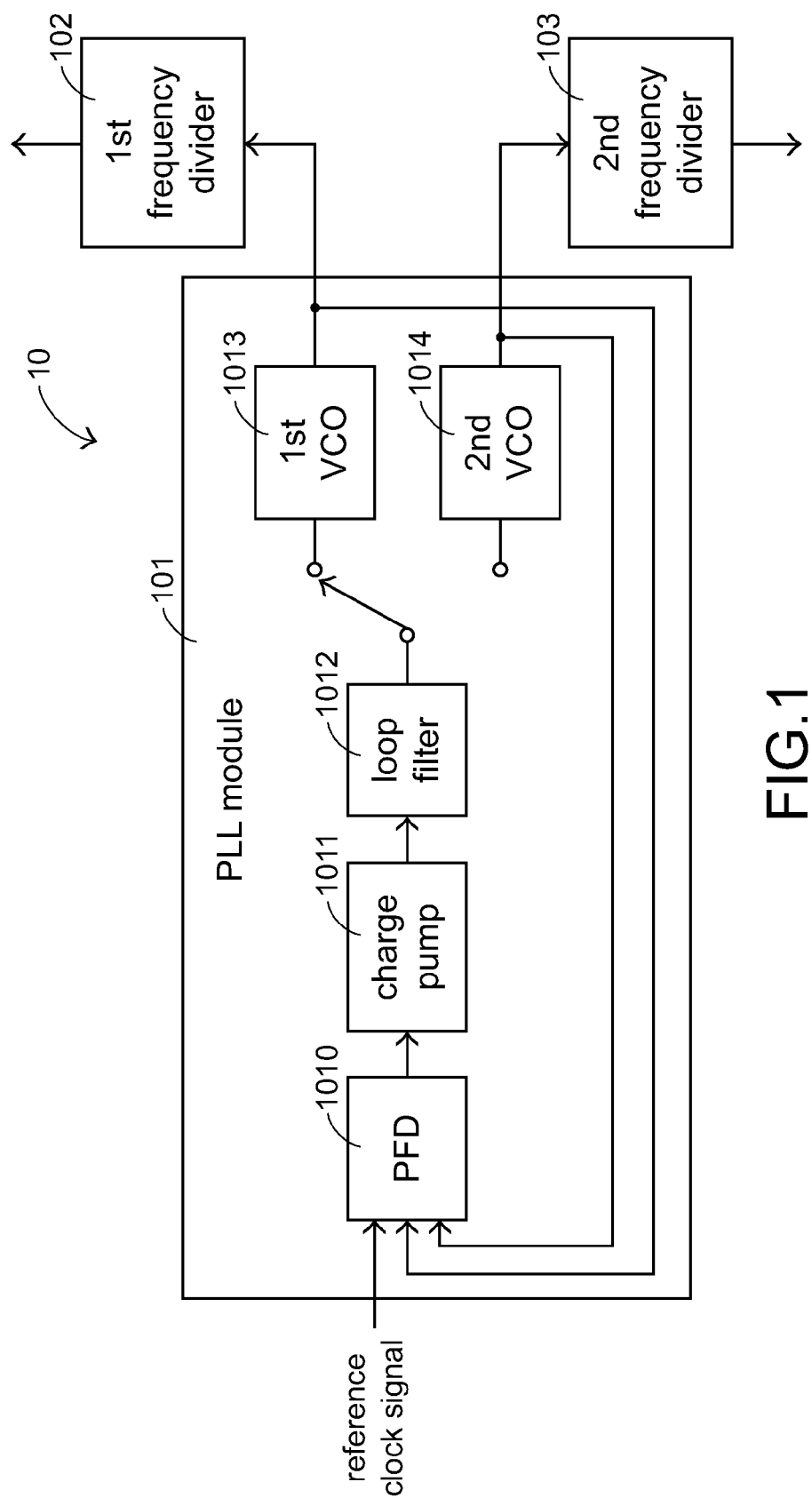
FIG. 1 is a block diagram of a frequency synthesizer conventionally used in a dual band RFID reader.
Figure 2:
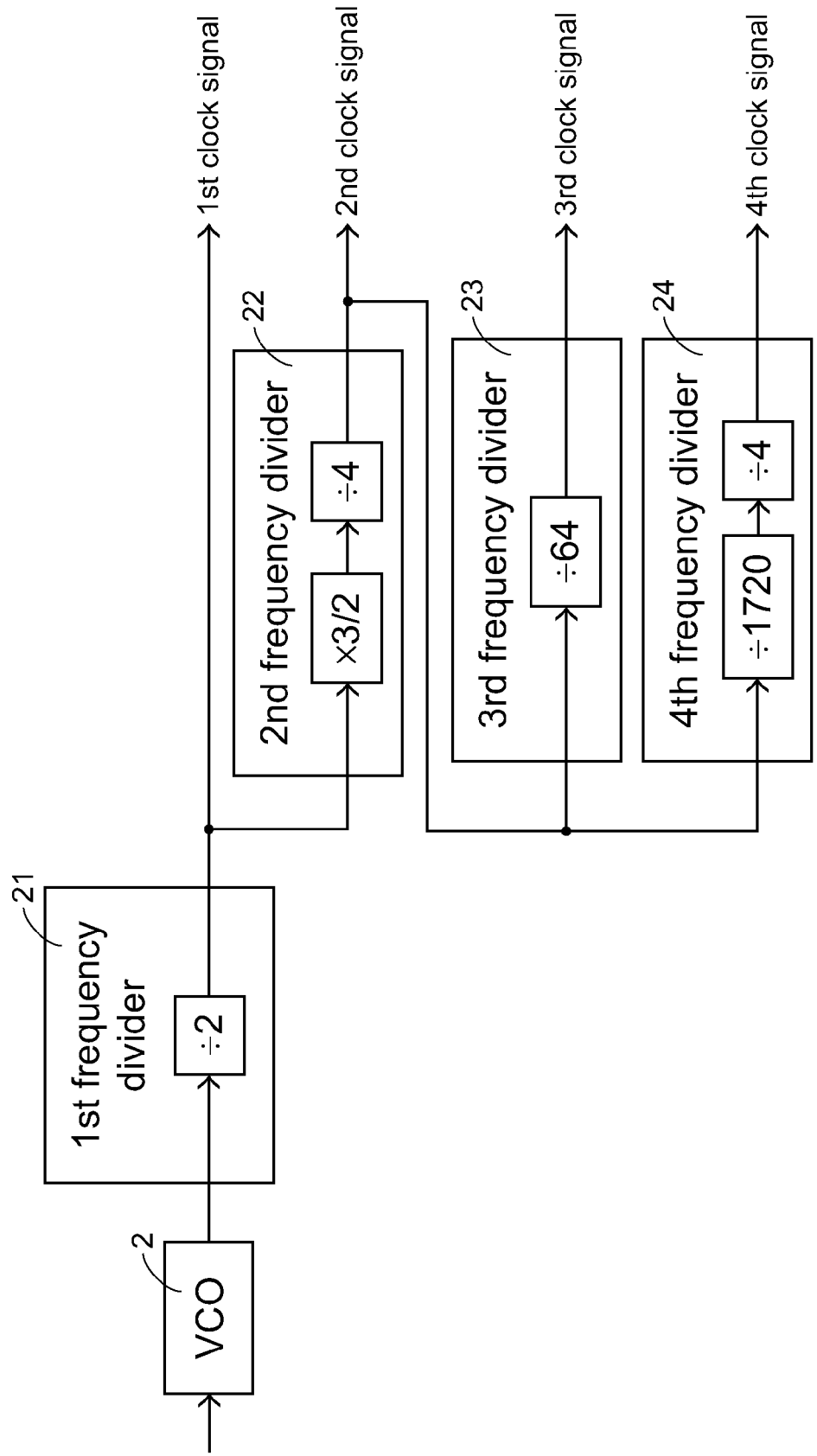
FIG. 2 is a block diagram illustrating a portion of a frequency synthesizer according to an embodiment of the present invention.

Please refer to FIG. 2 showing a block diagram of a portion of a frequency synthesizer according to an embodiment of the present invention. In this embodiment, a single voltage controlled oscillator (VCO) 2 with an operational frequency ranging from 4.8 GHz to 5 GHz is used, but the frequency synthesizer can provide both UHF band (860~960 MHz) clock signals and microwave band (2.4~2.5 GHz) clock signals. At first, the VCO 2 provides primary clock signals with frequency ranging from 4.8 GHz to 5 GHz. For the microwave band, a first frequency divider (divide-by-2) 21 can converts the primary clock signals into first clock signals with frequency ranging from 2.4 GHz to 2.5 GHz for a first band transceiver (not shown). For the UHF band, after a second frequency divider 22 performs 3/2 frequency conversion and divide-by-4 operation of the first clock signals, second clock signals with frequency ranging from 860 MHz to 960 MHz are obtained. As described, the RFID reader using the frequency synthesizer of the present invention can read both UHF band tags and microwave band tags.

Furthermore, the RFID system may be backward compatible with RFID tags operating at lower frequency, e.g. 13.56 MHz or 125 kHz, by providing additional frequency dividers.

In an embodiment, a third frequency divider 23 performs a divide-by-64 operation of the second clock signals to generate third clock signals with frequency covering 13.56 MHz. Similarly, a fourth frequency divider 24 performs a divide-by-1720 operation and a divide-by-4 operation of the second clock signals to generate fourth clock signals with frequency covering 125 kHz. It is advantageous that the frequency synthesizer using just a single VCO can generate four clock signals with different frequencies for operation with four kinds of RFID tags. Therefore, the RFID reader further extends to quadri-band RFID reader.

Since divide-by-2 frequency divider is a well know circuit, the relative details aren't described herein. The divide-by-4 operation and the divide-by-64 operation can be implemented by appropriate number of divide-by-2 frequency dividers arranged in series. As for other divide-by-n frequency divider, e.g. divide-by-1720 frequency divider in FIG. 2, it can be implemented by a conventional counter.

Figure 3:
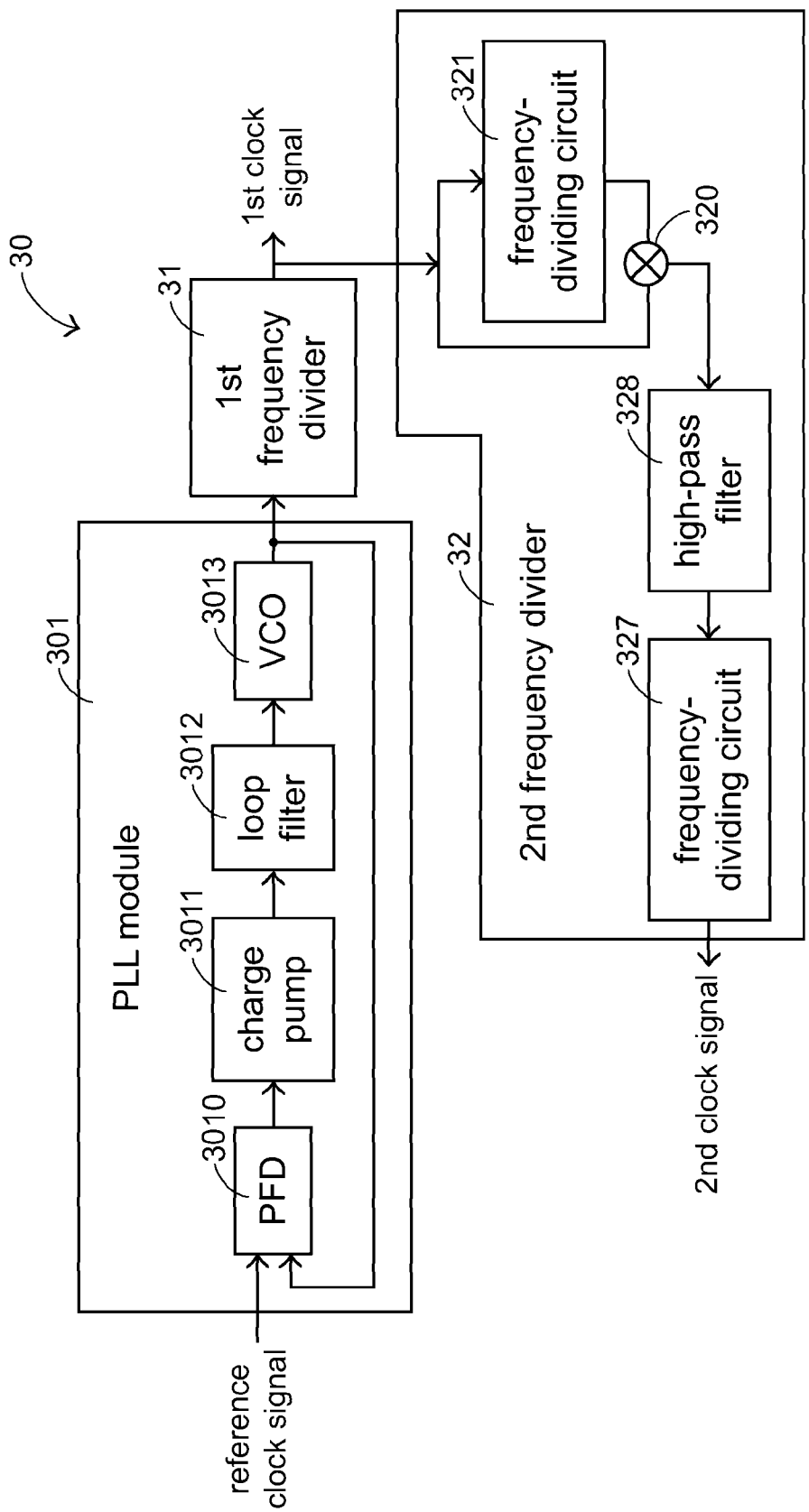
FIG. 3 is a block diagram illustrating a frequency synthesizer of the present invention.

Please refer to FIG. 3, a block diagram showing a frequency synthesizer according to the previously described principle. The frequency synthesizer 30 includes a phase-locked loop (PLL) module 301, a first frequency divider 31, and a second frequency divider 32. The PLL module 301 includes a phase/frequency detector (PFD) 3010, a charge pump, 3011, a loop filter 3012 and a single VCO 3013. In this embodiment, the VCO 3013 outputs primary clock signals with frequency ranging from 4.8 GHz to 5 GHz. With a divide-by-2 operation by the first frequency divider 31, the primary clock signals are converted into the first clock signals with frequency ranging from 2.4 GHz to 2.5 GHz.

3/2 frequency conversion part of the second frequency divider 22 can be implemented by a mixer 320 and a divide-by-2 frequency-dividing circuit 321. The first clock signals with frequency ranging from 2.4 GHz to 2.5 GHz are processed by the divide-by-2 frequency-dividing circuit 321 to generate frequency-dividing clock signals with frequency ranging from 1.2 GHz to 1.25 GHz. Then, the frequency-dividing clock signals are mixed with the first clock signals by the mixer 320. A mixer generates the sum of the frequencies of the input signals and the difference between the frequencies of the input signals. If the two input signals have frequencies of F and F/2, then the output signals have frequencies of 3F/2 and F/2. The high-pass filter 328 removes the lower-frequency signals (F/2) and passes the higher-frequency signals (3F/2). Hence, 3/2 frequency conversion is achieved. Later, the 3F/2 signals are processed by a divide-by-4 frequency-dividing circuit 327 to obtain second clock signals with frequency ranging from 860 MHz to 960 MHz. It is not intended to limit the 3/2 frequency conversion part to be arranged in the second frequency divider 31. The 3/2 frequency conversion part can be arranged in more than one frequency dividers to meet demands in generating clock signals having various frequencies for multiple-band transceiver.

Figure 4:
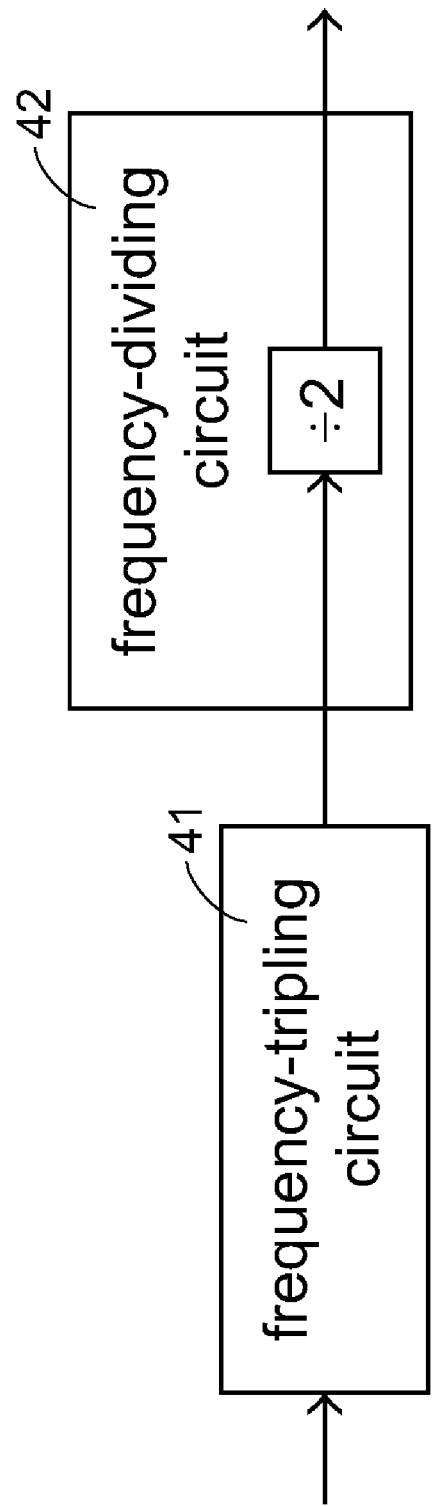
FIG. 4 is a block diagram illustrating a 3/2 frequency converter applied to the present invention.

Other implements for providing 3/2 frequency conversion are also applicable. For example, the clock signals processed by a frequency-tripling circuit 41 and further processed by a divide-by-2 frequency-dividing circuit 42 as shown in FIG. 4 are also converted into 3/2 frequency clock signals. The frequency-tripling circuit 41, for example, includes a frequency-doubling circuit, a mixer and a high-pass filter (not shown). The clock signals with frequency F are processed by the frequency-doubling circuit to generate frequency-doubling clock signals (2F). Then the frequency-doubling clock signals (2F) are mixed with the clock signals (F) to provide frequency-sum clock signals (3F) and frequency-difference clock signals (F). The high-pass filter removes the lower-frequency clock signals (F) and remains the higher-frequency clock signals (3F) to achieve the frequency-tripling operation.

In view of the foregoing, by applying several frequency dividers, the phase-locked loop module of a frequency synthesizer may reduce the quantity of VCOs. Preferably, a single VCO cooperated with suitable frequency dividers can cover several frequency ranges, e.g. UHF band, microwave band, and other lower bands. The simplified architecture of the frequency synthesizer has smaller size and more power-saving.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A frequency synthesizer applied to a first band transceiver and a second band transceiver, the first band transceiver being a first radio frequency identification reader, and the second band transceiver being a second radio frequency identification reader, the frequency synthesizer comprising:
   a phase-locked loop module, comprising a single voltage controlled oscillator which generates a primary clock signal with frequency ranging from 4.8 GHz to 5 GHz;
   a first frequency divider, disposed between the phase-locked loop module and the first band transceiver and coupled to an output of the single voltage controlled oscillator, for frequency-dividing the primary clock signal into a first clock signal with a first frequency with frequency range from 2.4 GHz to 2.5 GHz for the first band transceiver; and
   a second frequency divider, coupled to an output of the first frequency divider, for frequency-dividing the first clock signal into a second clock signal with a second frequency with frequency range from 860 MHz to 960 MHz for the second band transceiver, the second frequency being lower than the first frequency, wherein the second frequency divider comprises a 3/2 frequency conversion part for performing 3/2 frequency conversion, a high-pass filter and a divide-by-4 frequency-dividing circuit;
   a third frequency divider, coupled to an output of the second frequency divider, for frequency-dividing the second clock signal into a third clock signal with a third frequency lower than the second frequency; and
   a fourth frequency divider, coupled to the output of the second frequency divider, for frequency-dividing the second clock signal into a fourth clock signal with a fourth frequency lower than the second frequency, the fourth frequency being different from the third frequency;
   wherein the third frequency of the third clock signal and the fourth frequency of the fourth clock signal cover 13.56 MHz and 125 kHz, respectively.

2. The frequency synthesizer according to claim 1 wherein the phase-locked loop module comprises a phase/frequency detector, a charge pump, a loop filter and the voltage controlled oscillator.

3. The frequency synthesizer according to claim 1 wherein the first frequency divider comprises a divide-by-2 frequency-dividing circuit coupled to the voltage controlled oscillator for frequency-dividing the primary clock signal to generate the first clock signal.

4. The frequency synthesizer according to claim 1 wherein the second frequency divider comprises:
   a divide-by-2 frequency-dividing circuit coupled to the first frequency divider, for frequency-dividing the first clock signal to generate a frequency-dividing signal;
   a mixer, coupled to the first frequency divider and the divide-by-2 frequency-dividing circuit, for receiving the first clock signal and the frequency-dividing signal to generate an output signal having a higher-frequency portion and a lower-frequency portion; and
   a high-pass filter, coupled to the mixer, for receiving the output signal, removing the lower-frequency portion of the output signal and outputting the higher-frequency portion of the output signal.

5. The frequency synthesizer according to claim 4 wherein the second frequency divider further comprises a divide-by-4 frequency-dividing circuit coupled to the high-pass filter for frequency-dividing the higher portion of the output signal to generate the second clock signal.

6. A frequency synthesizing method applied to a first band transceiver and a second band transceiver, the first band transceiver being a first radio frequency identification reader, and the second band transceiver being a second radio frequency identification reader, the frequency synthesizing method comprising steps of:
   activating a phase-locked loop module to generate a primary clock signal with frequency ranging from 4.8 GHz to 5 GHz;
   frequency-dividing the primary clock signal into a first clock signal with a first frequency with frequency range from 2.4 GHz to 2.5 GHz for the first band transceiver;
   frequency-dividing the first clock signal into a second clock signal with a second frequency with a frequency range from 860 MHz to 960 MHz for the second band transceiver by performing a 3/2 frequency conversion using a high-pass filter and a divide-by-4-frequency-dividing circuit, wherein the second clock signal, the second frequency being lower than the first frequency;
   frequency-dividing the second clock signal into a third clock signal with a third frequency lower than the second frequency; and
   frequency-dividing the second clock signal into a fourth clock signal with a fourth frequency, the fourth frequency being lower than the second frequency and different from the third frequency;
   wherein the third frequency of the third clock signal and the fourth frequency of the fourth clock signal cover 13.56 MHz and 125 kHz, respectively.

7. The frequency synthesizing method according to claim 6 wherein the phase-locked loop module comprises a phase/frequency detector, a charge pump, a loop filter and a single voltage controlled oscillator.

8. The frequency synthesizing method according to claim 6 wherein the step of frequency-dividing the first clock signals further comprising steps of:
   frequency-dividing the first clock signal to generate a frequency-dividing signal;
   mixing the first clock signal and the frequency-dividing signal to generate an output signal having a higher-frequency portion and a lower-frequency portion; and
   filtering out the lower-frequency portion and outputting the higher-frequency portion as the second clock signal.

9. A multi-band RFID reader comprising:
   a phase-locked loop module, comprising a single voltage controlled oscillator which generates a primary clock signal with frequency ranging from 4.8 GHz to 5 GHz; a first frequency divider and a second frequency divider, coupled in series to an output of the single voltage controlled oscillator in that order, for sequentially frequency-dividing the primary clock signal into a first clock signal with a first frequency with frequency range from 2.4 GHz to 2.5 GHz for a first band transceiver and a second clock signal with a second frequency with frequency range from 860 MHz to 960 MHz for a second band transceiver, wherein the second frequency divider comprises a 3/2 frequency conversion part for performing 3/2 frequency conversion, a high-pass filter and a divide-by-4 frequency-dividing circuit; and
   a plurality of another frequency dividers, coupled in parallel to an output of the second frequency divider, for simultaneously frequency-dividing the second clock signal into a plurality of another clock signals with different frequencies covering 13.56 MHz and 125 kHz, respectively for a third band transceiver and a fourth band transceiver.

10. The multi-band RFID reader according to claim 9 wherein the first frequency divider is disposed between the phase-locked loop module and the first band transceiver and coupled to an output of the single voltage controlled oscillator, for frequency-dividing the primary clock signal into the first clock signal with the first frequency with frequency range from 2.4 GHz to 2.5 GHz for the first band transceiver.

11. The multi-band RFID reader according to claim 10 wherein the second frequency divider is coupled to an output of the first frequency divider, for frequency-dividing the first clock signal into the second clock signal with the second frequency with frequency range from 860 MHz to 960 MHz for the second band transceiver.

12. The multi-band RFID reader according to claim 11 wherein the 3/2 frequency conversion part is implemented by a mixer and a divide-by-2 frequency-dividing circuit, the first clock signals with frequency ranging from 2.4 GHz to 2.5 GHz are processed by the divide-by-2 frequency-dividing circuit to generate frequency-dividing clock signals with frequency ranging from 1.2 GHz to 1.25 GHz with frequency ranging from 1.2 GHz to 1.25 GHz, and then the frequency-dividing clock signals are mixed with the first clock signals by the mixer, the mixer generates the sum of the frequencies of the input signals and the difference between the frequencies of the input signals, the high-pass filter removes the lower-frequency signals and passes the higher-frequency signals, so that 3/2 frequency conversion is achieved, the higher-frequency signals are processed by the divide-by-4 frequency-dividing circuit to obtain the second clock signals with frequency ranging from 860 MHz to 960 MHz.

13. The multi-band RFID reader according to claim 11 wherein the 3/2 frequency conversion is implemented by a frequency-tripling circuit and a divide-by-2 frequency-dividing circuit, the first clock signals processed by a frequency-tripling circuit and further processed by a divide-by-2 frequency-dividing circuit are converted into 3/2 frequency clock signals.

14. The multi-band RFID reader according to claim 11, wherein the plurality of another frequency dividers comprising:
   a third frequency divider, coupled to an output of the second frequency divider, for frequency-dividing the second clock signal into a third clock signal with a third frequency covering 13.56 MHz lower than the second frequency.

15. The multi-band RFID reader according to claim 11, wherein the plurality of another frequency dividers comprising:
   a fourth frequency divider, coupled to the output of the second frequency divider, for frequency-dividing the second clock signal into a fourth clock signal with a fourth frequency covering 125 kHz lower than the second frequency, the fourth frequency being different from the third frequency.

* * * * *